(12) United States Patent
Vaturi

(10) Patent No.: US 9,086,443 B2
(45) Date of Patent: Jul. 21, 2015

(54) DETECTING A CONNECTION TYPE OF A PIN

(75) Inventor: Efi Vaturi, Ramat Gan (IL)

(73) Assignee: DSP GROUP LTD., Herzliya (IL)

( * ) Notice: Subject to any disclaimer, the term of this patent is extended or adjusted under 35 U.S.C. 154(b) by 300 days.

(21) Appl. No.: 13/878,759

(22) PCT Filed: Oct. 12, 2010

(86) PCT No.: PCT/IL2010/000830
§ 371 (c)(1),
(2), (4) Date: Apr. 11, 2013

(87) PCT Pub. No.: WO2012/049670
PCT Pub. Date: Apr. 19, 2012

(65) Prior Publication Data
US 2013/0221990 A1    Aug. 29, 2013

(51) Int. Cl.
| | | |
|---|---|---|
| *G01R 31/04* | (2006.01) | |
| *G01R 31/02* | (2006.01) | |
| *G01R 31/28* | (2006.01) | |
| *G01R 31/11* | (2006.01) | |
| *G01R 1/04* | (2006.01) | |

(52) U.S. Cl.
CPC .............. *G01R 31/04* (2013.01); *G01R 1/0408* (2013.01); *G01R 31/11* (2013.01); *G01R 31/2853* (2013.01); *G01R 31/046* (2013.01)

(58) Field of Classification Search
CPC .. G01R 27/2611; G01R 31/024; G01R 31/04; G01R 31/046; G01R 31/2812; G01R 31/2853; G01R 31/2886; G01R 1/0408; G01R 31/318505; G01R 31/318511; G01R 31/318513; G01R 31/31905; G01R 31/2831; G01R 31/2805; G01R 31/2808; G01R 31/021; G01R 31/11; G01R 1/04; G01R 1/0433; G01R 1/0483; H01L 22/34; H04B 3/00; H04B 3/46

USPC ................. 324/654, 649, 600, 500, 537, 538, 324/756.01, 756.05, 762.01, 762.02, 324/762.03, 762.05, 762.06, 763.01, 324/763.02, 756.02, 539, 543, 555

See application file for complete search history.

(56) References Cited

U.S. PATENT DOCUMENTS

| | | | | |
|---|---|---|---|---|
| 3,704,950 | A  * | 12/1972 | Rosencranz | ..................... 356/73 |
| 6,617,869 | B1 | 9/2003 | Pillkahn | |
| 7,057,395 | B1 * | 6/2006 | Williamson | .................. 324/519 |
| 7,068,480 | B2 * | 6/2006 | Wong et al. | ...................... 361/42 |
| 7,136,265 | B2 * | 11/2006 | Wong et al. | ...................... 361/42 |
| 7,295,031 | B1 * | 11/2007 | Parker et al. | ............. 324/754.28 |
| 7,965,088 | B2 * | 6/2011 | Thorngreen et al. | .......... 324/538 |
| 2003/0093730 | A1 | 5/2003 | Halder | |
| 2004/0230387 | A1 | 11/2004 | Bechhoefer | |
| 2004/0232919 | A1 | 11/2004 | Lacey | |

* cited by examiner

*Primary Examiner* — Hoai-an D Nguyen
(74) *Attorney, Agent, or Firm* — Reches Patents

(57) ABSTRACT

The subject matter discloses an apparatus configured for detecting type of a connection of an electrical module to an electrical node of an electrical circuit, the apparatus comprising a pulse generator configured for generating a first pulse; and a sampling circuit configured for applying a reaction of the electrical circuit on the first pulse to provide a sampled pulse and for detecting the type of connection from the sampled pulse. The electrical module comprising a capacitor or an inductor.

20 Claims, 6 Drawing Sheets

US 9,086,443 B2

DETECTING A CONNECTION TYPE OF A PIN

FIELD OF THE INVENTION

The present disclosure relates to chip architecture in general, and to chip configuration in particular.

BACKGROUND

A chip may have different modes and configurations. For example one of the pins can be used either as output of linear regulator or as a DC-to-DC convertor coil pin. In the first case when it is configured to linear regulator the pin is connected to a capacitor. In the other case when it is configured to DC-to-DC, the pin is connected to a coil inductor or another electrical module that reacts to electrical current differently than a capacitor.

In order to detect the configuration of the chip, a strap may be used. A strap is a pin, which can be used in the startup for identifying a configuration or a mode of the chip according to their state, whether they are tied up or down. In some cases, there are no free pins for strapping since all the pins of the chip are occupied by other strap options or being used in power up of the chip.

BRIEF SUMMARY OF THE INVENTION

One exemplary embodiment of the disclosed subject matter is an apparatus configured for detecting type of a connection of an electrical module to an electrical node of an electrical circuit. The apparatus comprising a pulse generator configured for generating a first pulse and a sampling circuit configured for sensing a reaction of the electrical circuit on the first pulse to provide a sampled pulse and for detecting the type of connection from the sampled pulse. The electrical circuit comprising a capacitor or an inductor.

The pulse generator is further configured for determining a level of voltage of the electrical node for generating the first pulse when the level of the voltage is below a threshold when the first pulse is positive and when the level of the voltage is above a threshold when the first pulse is negative. The apparatus further comprising a buffer configured for intensifying the first pulse prior to the sampling. The sampling circuit is further configured for filtering dynamic noise from the sampled pulse prior to the detecting. The pulse generator is connected to the buffer for inputting the first pulse and is connected to the sampling circuit for inputting the first pulse. The buffer is connected to the pulse generator for receiving the first pulse, and wherein the buffer is connected to the sampling circuit. The sampling circuit is connected to the buffer for and wherein the sampling circuit is connected to the pulse generator for receiving the first pulse. The sampling circuit comprises a delay circuit configured for shifting the first pulse to provide a shifted pulse. The sampling circuit further comprises an AND logic gate for combining the sampled pulse with the shifted pulse for detecting the type of connection. The sampling circuit further configured for outputting a result of the detection. The sampling circuit further comprises a retainer unit for retaining the result. The retainer unit comprises a flip flop. The electrical circuit comprises a chip. The electronic node comprises a pin.

Another exemplary embodiment of the disclosed subject matter is a method for detecting type of connection of an electrical module to an electronic node of an electrical circuit; the method comprising generating a first pulse, applying a reaction of the electrical circuit on the first pulse to provide a sampled pulse and detecting the type of connection from the sampled pulse. The electrical circuit comprising a capacitor or an inductor. The method further comprising determining that a level of voltage of the electrical circuit is below a threshold prior to the generating the first pulse when the first pulse is positive and determining that a level of voltage of the electrical circuit is above a threshold prior to the generating the first pulse hen the first pulse is negative. The method further comprising outputting a result of the detection. The method further comprises retaining the result. The method further comprises intensifying the first pulse to provide an intensified pulse for the applying the reaction on the intensified pulse. The method further comprises filtering dynamic noise from the intensified pulse for the detecting the type of connection. The method further comprises calibrating a power of the intensifying for adapting the electrical circuit to limiting parameter. The method further comprises calibrating width of the first pulse for adapting the electrical circuit to limiting parameters. The electrical circuit may be a chip. The electronic node may be a pin.

BRIEF DESCRIPTION OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIGS. 7s 7a and 7b show a schematic drawing of an embodiment of a three state buffer, in accordance with some exemplary embodiments of the disclosed subject matter.

DETAILED DESCRIPTION

One technical problem dealt with by the disclosed subject matter is to be able to detect if an electric node of an electrical circuit is connected to a capacitor or to inductor. The electrical circuit may be, for example, a chip, a printed circuit and the like. An electronic node may be, for example, a pin.

Another technical problem dealt with by the disclosed subject matter is to be able to detect if a pin of a chip is connected to a capacitor or to inductor.

One technical solution comprises applying a pulse on such an electronic node and testing the voltage. Such a solution comprises the capacitance and inductance response to voltage step; wherein the capacitance responses slowly to voltage step and the inductance responses fast to voltage step. The pulse may be either a positive pulse or a negative pulse.

Figure 1:
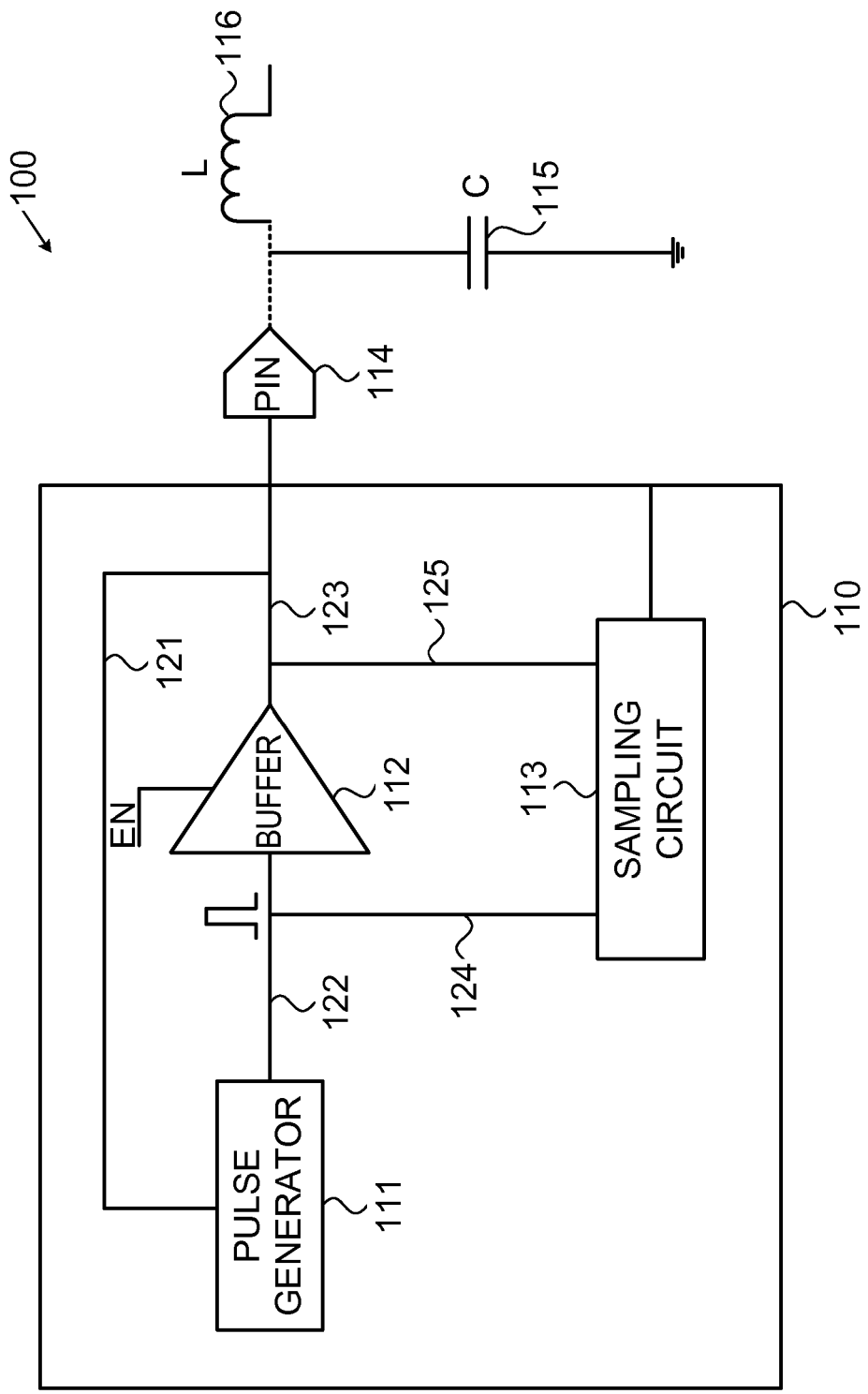
FIG. 1 shows a schematic drawing of an electrical module configured for detecting a connection to an electronic node when a positive pulse is applied, in accordance with some exemplary embodiments of the disclosed subject matter.

FIG. 1 shows a schematic drawing of a module configured for detecting a connection of an electronic node, in accordance with some exemplary embodiments of the disclosed subject matter. The electronic node may be a pin of a chip, for example, when there is no other available method to set the pin configuration to distinguish whether the electrical circuit is connected to a capacitor or to an inductor. Such other method may be, for example, using a strap or a bit in pre-programmed ROM or other memory.

In some exemplary embodiments, a pulse may be applied on the electronic node to which either a capacitor or an inductor is connected. The pulse may be either a positive pulse or a negative pulse. This pulse may be sampled for determining whether the electrical circuit is connected to a capacitor or to an inductor. Such detection uses the deferent reaction of the capacitor and the inductor response to voltage step. In general, the voltage change, when the electronic node is connected to capacitance is significantly lower than the voltage change when the electronic node is connected to an inductor.

System 100 comprises an electrical module 110 for detecting if an electric node of an electrical circuit is connected to a capacitor or to inductor The electrical module 110 comprises a pulse generator 111, a buffer 112, a sample circuit 113 and an electric node 114. The buffer 112 may be a three state buffer. The electric node 114 may be a pin and the electrical circuit (not shown) may be part of a chip. The electrical module 100 may be embedded in the electrical circuit (not shown).

The pulse generator 111 may be configured for verifying if the voltage level of the pin is below or above some threshold and for generating a pulse, when the voltage level of the electronic node 114 is below some threshold when the pulse is positive and above some threshold when the pulse is negative. Enabling the electrical circuit to be discharged to a low level when a positive pulse is used and to be charged to a high level when a negative pulse is used may prevent a false detection. Such a false detection may detect that the electronic node is connected to an inductor when the electronic node is connected to a charged capacitor in positive pulse case. In case of a chip, such a false detection may occur when the chip is shut off for a short time and then turned on again before the capacitor has managed to discharge. The pulse generator 111 may be connected to the buffer 112 via line 122 for inputting the pulse via the buffer 112. The pulse generator 111 may be connected to the electronic node 114 via line 121 and to the sampling circuit 113 via line 124 for inputting the original pulse.

The buffer 112 may be configured for intensifying the pulse over the electrical node for overcoming limitation such as parasitic capacitance and to present low resistance to the devices connected to the pin. The buffer 112 may be connected to the pulse generator 111 via line 122 for receiving an input, and to the sampling circuit 113 via line 125 for sensing the reflection of the pulse on the electrical node. The sampling circuit 113 may be configured for excluding from the detection the dynamic noise caused by the capacitor and any parasitic inductance such as bond wire inductance in the package, in a case of a chip, at the initial time. Such dynamic noise is described in greater detail in FIG. 4. Such excluding may comprise filtering. The buffer 112 may be connected to the electronic node 114 via line 123 for applying the pulse for determining whether the electrical circuit (not shown) is connected to a capacitor or an inductor.

The sampling circuit 113 may detect the type of configuration after filtering the parasitic noise at initiation and may sample a first value, such as, '1' if the electronic node is connected to an inductor or a second value, such as '0', if the pin is connected to a capacitor. The sampling circuit 113 may be connected to the pulse generator 111 via line 124 for receiving the original pulse and connected to the buffer 112 via line 125 for receiving the reflected pulse for determining the type of connections to the electronic node 114. An embodiment of the sampling circuit 113 is described in greater details in FIG. 2.

Figure 2:
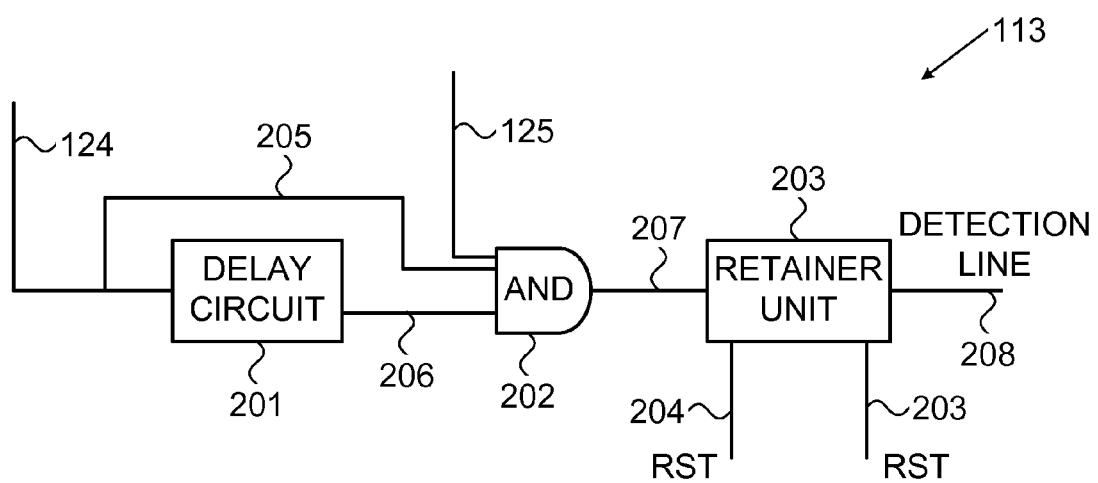
FIG. 2 shows a block diagram of an exemplary sampling circuit, in accordance with some exemplary embodiments of the disclosed subject matter.

FIG. 2 shows a block diagram of an exemplary sampling circuit when using a positive pulse, in accordance with some exemplary embodiments of the disclosed subject matter. According to one embodiment a positive pulse may be applied on the electronic node, in such a case an AND logic gate may be used. According to other embodiment a negative pulse may be applied on the electronic node, in such a case an OR logic gate may be used. Sampling circuit 113 may comprise an "AND" logic gate 202, a delay circuit 201 and a retainer unit 203. The retainer unit 203 may comprise a flip-flop cell.

The delay circuit 201 may filter the initiation time of the pulse, for excluding the dynamic noise caused by the capacitor and the parasitic elements at the initial time from being detected. Such dynamic noise is described in greater detail in FIG. 4. Filtering the pulse during initiation time may comprise a step of shifting the pulse in such a way that the delayed pulse may be a shifted pulse. The delay circuit 201 may be connected to the pulse generator 111 described in FIG. 1 via line 124 for receiving the original pulse. The delay circuit 201 may be connected to the "AND" logic gate 202 via line 206 for inputting the delayed pulse and via line 205 for inputting the original pulse.

The "AND" logic gate 202 may receive the reflected pulse, the shifted pulse and the original pulse for determining the connection to the electronic node. The output of the "AND" logic gate 202 may be "1" only if all the value inputted into the gate is "1". As a result, inputting the delayed pulse prevents false detection of the connection of the electronic node of an electrical circuit to a capacitor. Inputting the original pulse to the AND gate is done to terminate the sampling when the original pulse ends.

Figure 3:
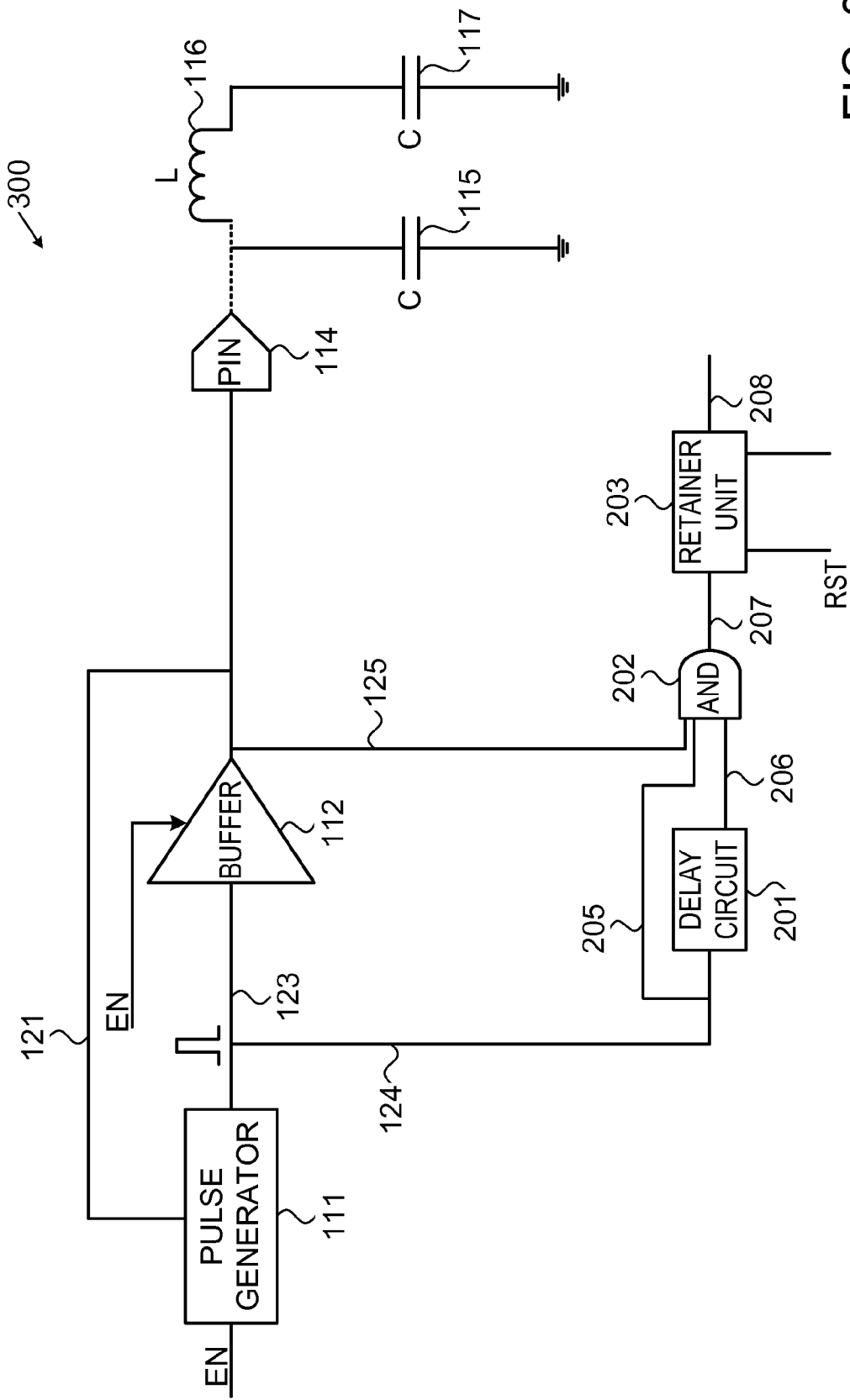
FIG. 3 shows a block diagram of an exemplary embodiment of a module for distinguishing between a configuration of an linear regulator to a configuration of a DC to DC convertor when sharing the same pin and when a positive pulse is applied.

The "AND" logic gate 202 may be connected to the delay circuit 201 as disclosed above and may also be connected to the output of buffer 112 described in FIG. 1 via line 125 for receiving the reflected pulse as it responds to reaction of a capacitor or an inductor to voltage step. The output of the "AND" logic gate 202 may be used as an input for the retainer unit 203. Connection may be via line 207. The SR-FF (Set/Reset Flip Flop) cell may be used in the retainer unit 203 to retain the output value of the "AND" logic gate 202. The retained value may be used for determining the type of connection of the electronic node. The value may be retained until the next power up sequence of the electrical circuit FIG. 3 shows a block diagram of an exemplary embodiment of an electrical module for distinguishing between a configuration of a linear regulator and a configuration of a DC-to-DC convertor when sharing the same pin and when a positive pulse is applied. According to one embodiment a positive pulse may be applied on the electronic node, in such a case an AND logic gate may be used. According to other embodiment a negative pulse may be applied on the electronic node, in such a case an OR logic gate may be used. According to an exemplary embodiment, a voltage regulator may be configured as a linear regulator or as a DC-to-DC converter. The two configurations may be used in two different systems. According to this embodiment, the output pin 114 may be the output of a linear regulator that comprises a capacitor 115 or output of step down DC-to-DC that comprises an inductor L 116 and a capacitor C 117. As the behavior of the pin 114 changes according to the connection, the AND logic gate in conjunction of the retainer unit can determine whether the pin is connected to the capacitor 115 or to an electronic circuit comprising both the inductor 116 and the capacitor 117. The connection of the pin 114 determines the configuration of the electrical circuit (not shown).

Figure 4:
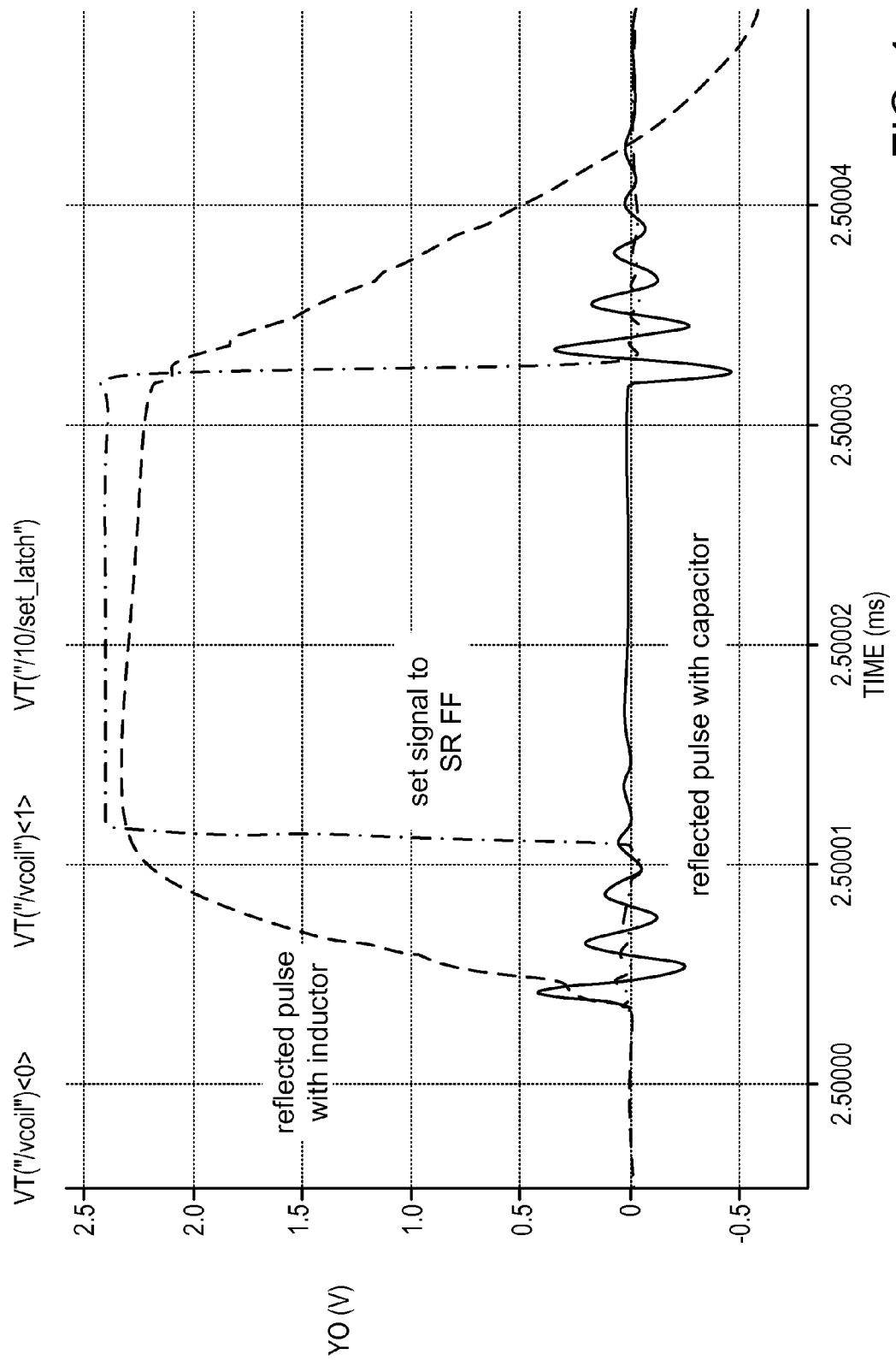
FIG. 4 shows an diagram comparing the pulse behavior of an electronic node connected to a capacitor to the pulse behavior of an electronic node connected to an inductor, in accordance with some exemplary embodiments of the disclosed subject matter.

FIG. 4 shows a diagram comparing the pulse behavior of an electronic node connected to a capacitor to the pulse behavior of an electronic node connected to an inductor, in accordance with some exemplary embodiments of the disclosed subject matter. The exemplary diagram shows that the voltage increases for a long interval when the electronic node is connected to an inductor. The exemplary diagram shows that the voltage fluctuates for a short interval at the beginning and at the end of the pulse when the electronic node is connected to a capacitor. Such short intervals may be filtered by the sample circuit as explained in greater details in FIG. 2. The values provided in the graph of FIG. 4 are inputted into the AND logic gate. In one exemplary embodiment, the pulse is a positive pulse. In such a case, the AND logic gate may output a '1' value in case detected signal is higher than a threshold and the voltage provided from the pulse generator is still '1'

Figure 5:
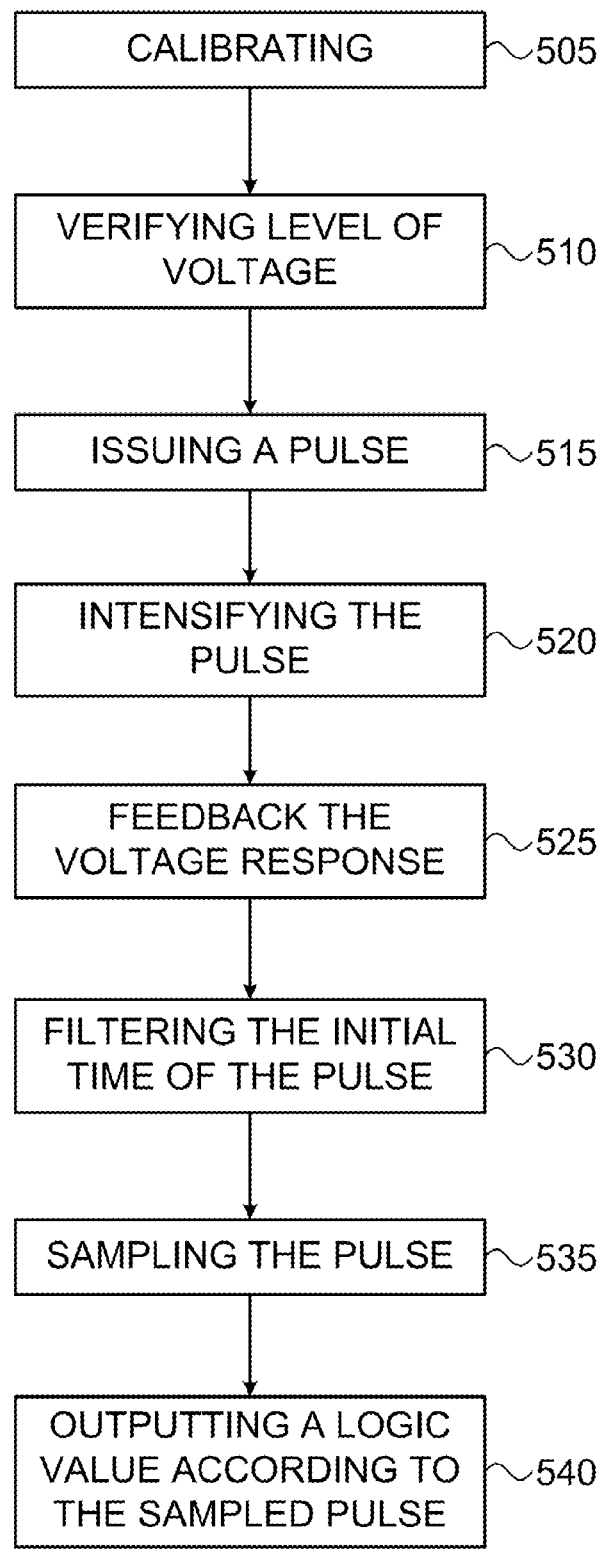
FIG. 5 shows a flowchart diagram of a method for detecting a connection to an electric node, in accordance with some exemplary embodiments of the disclosed subject matter.

FIG. 5 shows a flowchart diagram of a method for detecting a connection to an electronic node, in accordance with some exemplary embodiments of the disclosed subject matter.

In step 505, a calibration may be performed before implementing the circuit. Calibration may be performed for adapting the electrical circuit to limiting parameters. Such parameters may be the minimum capacitance of the connected capacitor; the minimum inductance of the connected inductor and the maximum parasitic capacitance of the detected node in a case of inductor configuration. Parasitic capacitance may also refer to the capacitance of the wire connecting the chip to the pin. Such parasitic capacitance may be the sum of the electronic node capacitance; the board's trace capacitance, the probe of measurement equipment if connected and any other parasitic capacitance. According to embodiments of the present invention, low capacitance of the capacitor and/or low inductance of the inductor and/or high parasitic capacitance of the electrical node may prevent a reliable distinguishing of whether the electronic node is connected to a capacitor or an inductance. Thus, the width of the pulse and/or the strength of the signal generated by the buffer may be calibrated prior to using the circuit for compensating the low capacitance of the capacitor and/or low inductance of the inductor and/or high parasitic capacitance of the capacitor. Such compensation comprises increasing the width of the pulse and/or the strength of the signal generated by the buffer for low inductance and/or high parasitic capacitance.

Steps 510-540 may be performed after calibration. In step 510, the level of the voltage on the electronic node may be verified. Verifying the level of the voltage may be done for enabling the electrical circuit to be discharged to a low level before starting the detection process or charged to high level if the pulse is negative. Enabling the electrical circuit to be discharged to a low level may prevent a false detection of an inductor when the electronic node is connected to a charged capacitor. Such a false detection may occur when the electronic node is shut off for short time and then is turned on again before the capacitor has managed to discharge if the electronic node was charged before this event or in any other case when the capacitor has an initial charge before starting the detection. A discharge circuit (e.g. NMOS transistor) may be added to urge the discharging in such cases.

In step 515, which is performed after determining that the level of the voltage is within the correct threshold, a pulse is generated. Generating the pulse may take into consideration the result of the calibration. In step 520, the pulse may be intensified mainly in current aspect according to calibration described in step 505.

In step 525, a feedback of the voltage response of the capacitor or the inductor is measured as the feedback is reflected on the pin.

In step 530, the initiation time of the pulse may be filtered. Filtering the initial time of the pulse may be done by shifting the pulse. Filtering the initiation time of the pulse and filtering the shifting duration of the time shifted pulse may be performed for excluding the dynamic noise caused by the capacitor at the initial time and at the end of the pulse from detection. Such dynamic noise is described in greater detail in FIG. 4.

In step 535, the pulse may be sampled for detecting the type of connection. If the level of the pulse is high enough and long enough, the output may be 1. The output is to the sampling unit and a connection to an inductor may be detected. If the level of the pulse is low, a connection to a capacitor may be detected.

In step 540, a logic value is outputted according to the detection. For example, the value '1' may be outputted if the electronic node is connected to inductance and the value '0' may be outputted, if the electronic node is connected to capacitance.

Figure 6:
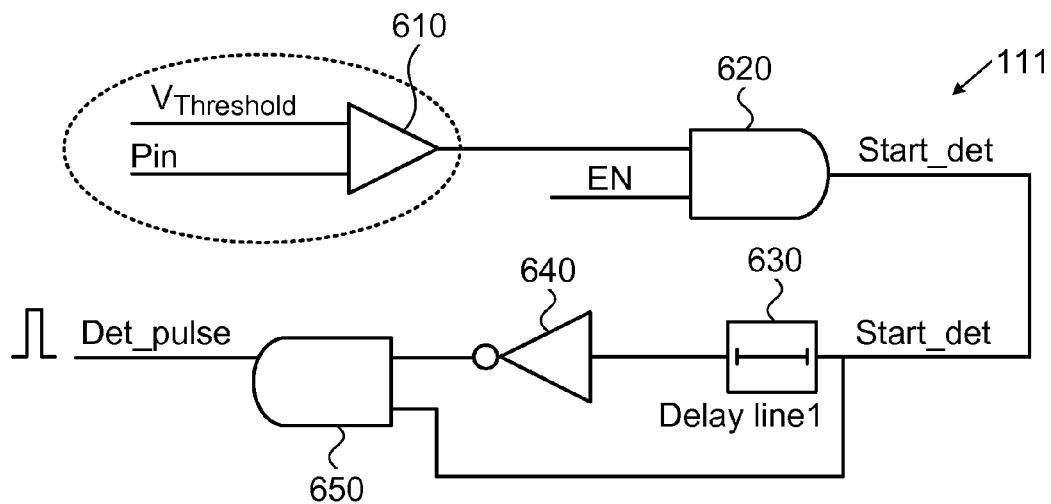
FIG. 6 show a schematic drawing of an embodiment of a pulse generator when a positive pulse is applied, in accordance with some exemplary embodiments of the disclosed subject matter.

FIG. 6 shows a schematic drawing of an embodiment of a pulse generator when a positive pulse is applied, in accordance with some exemplary embodiments of the disclosed subject matter. According to one embodiment, a positive pulse may be applied on the electronic node, in such a case an AND logic gate may be used. According to other embodiment, a negative pulse may be applied on the electronic node, in such a case an OR logic gate may be used. The pulse generator 111 may comprise a comparator 610 for determining that a level of voltage of the electrical circuit is low enough. The comparator 610 may be connected to an AND logic gate 620 for conditioning the pulse. The AND logic gate 620 may also receive Enable for enabling the pulse. The AND logic gate may be connected to an inverter 640 for inverting the delayed pulse. The inverted delayed pulse and the first pulse are inputted to the AND logic gate 650 for generating the pulse.

Figure 7A:
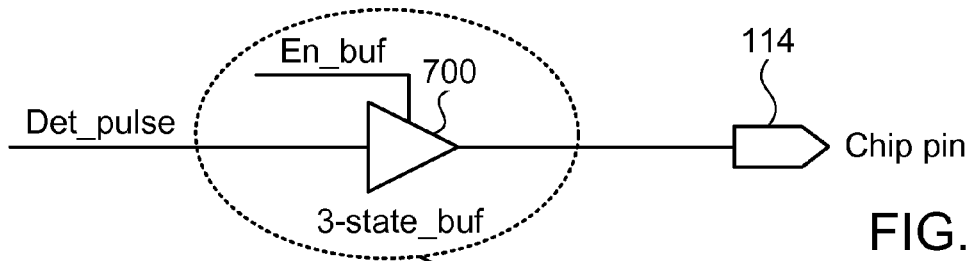
Figure 7B:
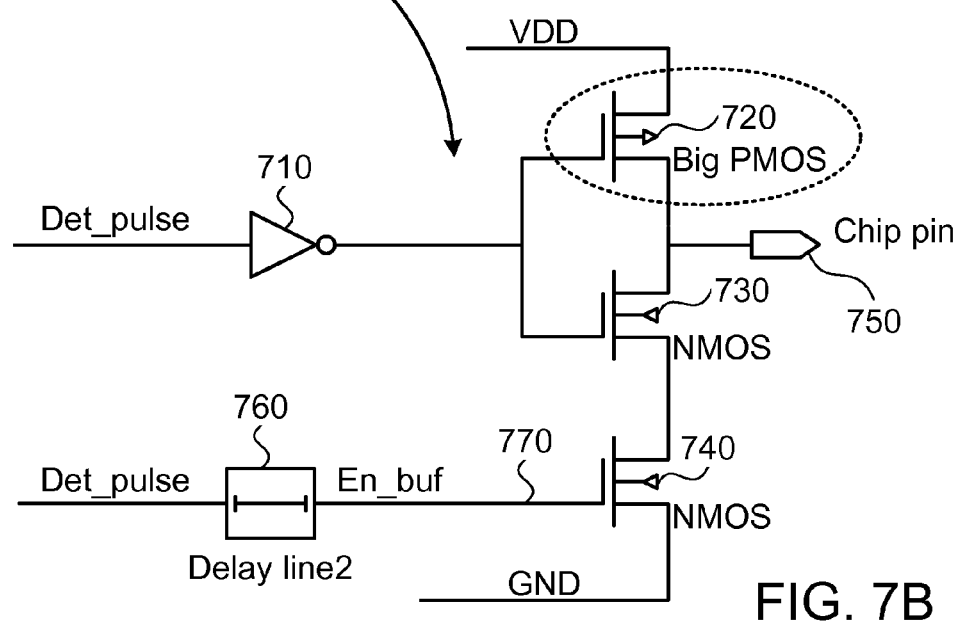

FIGS. 7*a* and 7*b* show a schematic drawing of an embodiment of a three state buffer, in accordance with some exemplary embodiments of the disclosed subject matter. FIG. 7*a* shows a three state buffer 700 connected to the pin 114. FIG. 7*b* shows a schematic drowning of the three state buffer, in accordance with some exemplary embodiments of the disclosed subject matter. The three state buffer 700 comprises an inverter 710, NMOS transistor 740, a Big PMOS transistor 720 for intensifying the pulse and an NMOS transistor 730. Applying the original pulse through a delay line 760 on en_buf input 770, which may be the gate of NMOS 740, allows the buffer to output the intensified pulse to the pin and to be disconnected from the pin a delay time after the original pulse ends, wherein the delay time is the delay time of delay line 760.

While the disclosure has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the disclosed subject matter not be limited to the particular embodiment disclosed as the best mode contemplated for carrying out this invention, but only by the claims that follow.

What is claimed is:

1. An apparatus configured for detecting a type of a connection of an electrical module to an electrical node of an electrical circuit, the apparatus comprising:
    a pulse generator configured for generating a first pulse; and
    a sampling circuit configured to accept as input, the first pulse and a sampled pulse that is a reflection from a reaction of the electrical node of the electrical circuit to the first pulse;
    wherein the sampling circuit provides as output an indication detecting if the electrical circuit comprises a capacitor or an inductor in the connection between the electrical module and the electrical node.

2. The apparatus according to claim 1, wherein the pulse generator is further configured for determining a level of voltage of the electrical node of the electrical circuit before generating the first pulse; wherein the pulse is generated when the level of the voltage is below a threshold value when the first pulse is positive and when the level of the voltage is above a threshold value when the first pulse is negative.

3. The apparatus according to claim 1 further comprising a buffer configured for intensifying the first pulse prior to the sampling.

4. The apparatus according to claim 1 wherein sampling circuit is further configured for filtering dynamic noise from the sampled pulse prior to the detecting.

5. The apparatus according to claim 3, wherein the pulse generator is connected to the buffer for providing the first pulse to the electrical node and is connected to the sampling circuit for inputting the first pulse into the sampling circuit.

6. The apparatus according to claim 3, wherein the buffer is connected to the pulse generator for receiving the first pulse, and wherein the buffer is connected to the sampling circuit to allow the sampled pulse to be input to the sampling circuit.

7. The apparatus according to claim 1, wherein the electrical circuit is a chip.

8. The apparatus according to claim 1, wherein the sampling circuit further comprises a delay circuit configured for shifting the first pulse to provide a shifted pulse and
    Wherein the sampled circuit comprises a logic gate that accepts the first pulse, the shifted pulse and the sampled pulse to detect the type of connection.

9. The apparatus according to claim 1, wherein the first pulse is a positive pulse and wherein the sampling circuit further comprises an AND logic gate for combining the sampled pulse with the first pulse to detect the type of connection.

10. The apparatus according to claim 1, wherein the first pulse is a negative pulse and wherein the sampling circuit further comprises an OR logic gate for combining the sampled pulse with the first pulse to detecting the type of connection.

11. The apparatus according to claim 1, wherein the sampling circuit further comprises a retainer unit for retaining the result.

12. The apparatus according to claim 11, wherein the retainer unit comprises a flip flop.

13. A method for detecting a type of connection of an electrical module to an electronic node of an electrical circuit; the method comprising:
    generating a first pulse;
    applying the first pulse to the electronic node of the electrical circuit;
    sensing a reflection from a reaction of the electrical circuit to the first pulse to provide a sampled pulse;
    inputting the first pulse and the sampled pulse into a sampling circuit; and
    detecting based on an output of the sampling circuit, if the type of connection between the electrical module and electrical node in the electrical circuit comprises a capacitor or an inductor.

14. The method according to claim 13, wherein the method further comprises filtering dynamic noise from the sampled pulse for the detecting of the type of connection.

15. The method according to claim 13; wherein the method further comprises calibrating a power of the intensifying for adapting the electrical circuit to limiting parameters.

16. The method according to claim 13; wherein the method further comprises calibrating a width of the first pulse for adapting the electrical circuit to limiting parameters.

17. The method according to claim 13, further comprising determining that a level of voltage of the electrical circuit is below a threshold prior to the generating of the first pulse if the first pulse is positive and determining that a level of voltage of the electrical circuit is above a threshold prior to the generating of the first pulse if the first pulse is negative.

18. The method according to claim 13, further comprising outputting a result of the detection.

19. The method according to claim 18; wherein the method further comprises retaining the output result.

20. The method according to claim 13, wherein the method further comprises intensifying the first pulse to provide an intensified pulse for the applying of the first pulse.

* * * * *